(12) United States Patent
Liang et al.

(10) Patent No.: US 8,644,032 B2
(45) Date of Patent: Feb. 4, 2014

(54) ELECTRONIC DEVICE WITH CLIP CARD INSTALLATION ASSEMBLY

(75) Inventors: Yan Liang, Shenzhen (CN); Bin Dai, Shenzhen (CN); Jing-Hua Yuan, Shenzhen (CN); Fa-Guang Shi, Shenzhen (CN); Zi-Ming Tang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 174 days.

(21) Appl. No.: 13/178,663

(22) Filed: Jul. 8, 2011

(65) Prior Publication Data

US 2012/0134127 A1 May 31, 2012

(30) Foreign Application Priority Data

Nov. 30, 2010 (CN) .......................... 2010 1 0565831

(51) Int. Cl.
*H05K 7/02* (2006.01)
*H05K 7/04* (2006.01)
*G06F 1/16* (2006.01)
*H05K 5/00* (2006.01)
*H05K 7/00* (2006.01)
*H05K 7/16* (2006.01)
*H04M 1/00* (2006.01)

(52) U.S. Cl.
USPC ...... 361/807; 361/810; 361/683; 361/679.58; 361/726; 361/679.31; 361/679.32; 361/679.3; 361/679.55; 361/679.56; 455/575.1; 455/575.2; 455/575.3; 455/575.4; 455/575.5; 455/575.6; 455/575.7; 455/575.8; 455/575.9

(58) Field of Classification Search
USPC ................... 361/807, 726, 679.58, 810, 683, 361/679.31, 679.32, 679.3, 679.55, 679.56; 455/575.1–575.9
See application file for complete search history.

(56) References Cited

U.S. PATENT DOCUMENTS

| | | | |
|---|---|---|---|
| 2007/0060198 A1* | 3/2007 | Kuo ............................ | 455/558 |
| 2008/0055838 A1* | 3/2008 | Liao ........................... | 361/683 |
| 2008/0318646 A1* | 12/2008 | Lin ........................... | 455/575.4 |
| 2009/0137268 A1* | 5/2009 | Fukazawa et al. ......... | 455/556.1 |
| 2010/0128420 A1* | 5/2010 | Li et al. .................... | 361/679.01 |

* cited by examiner

*Primary Examiner* — Anthony Haughton
*Assistant Examiner* — Zhengfu Feng
(74) *Attorney, Agent, or Firm* — Altis Law Group, Inc.

(57) ABSTRACT

An electronic device includes a housing and an installation assembly. The housing defines an opening. The installation assembly includes a fixing member and a holding member. The fixing member includes a base and a fixing portion protruding from the base. The base defines an entrance corresponding to the opening. The holding member comprising a holding portion and an engaging portion formed on an end of the holding portion. The fixing portion runs through the opening, and the base abuts against an outer surface of the housing with the entrance corresponding to the first opening. The engaging portion is engaged with the fixing portion to fix the holding member to the fixing member in the housing, and the engaging portion abuts against an inner surface of the housing, such that the installation assembly is fixed the housing surrounding the first opening.

10 Claims, 6 Drawing Sheets

ELECTRONIC DEVICE WITH CLIP CARD INSTALLATION ASSEMBLY

BACKGROUND

1. Technical Field

The present disclosure relates generally to electronic devices, particularly, to an electronic device with an installation assembly to hold a clip card.

2. Description of Related Art

Clip cards, such as a SD card (Secure Digital Memory Card), CF card (Compact Flash Card), SIM card (Subscriber Identification Module Card) and so on, are used in multi-functional portable electronic devices for storage or communication. For installing the clip card in the portable electronic device, the portable electronic device should preset a clip card fixing mechanism. The clip card fixing mechanism is often fixed in the housing of the portable electronic device by welding or threaded engagement. If the housing of the portable electronic device is made of metal, the housing is typically processed by punching to define an opening. This will result in a decrease in the mechanical strength of the housing around the opening; then the housing may be deformed or destroyed when the fixing mechanism is welded or threadedly engaged in the housing.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
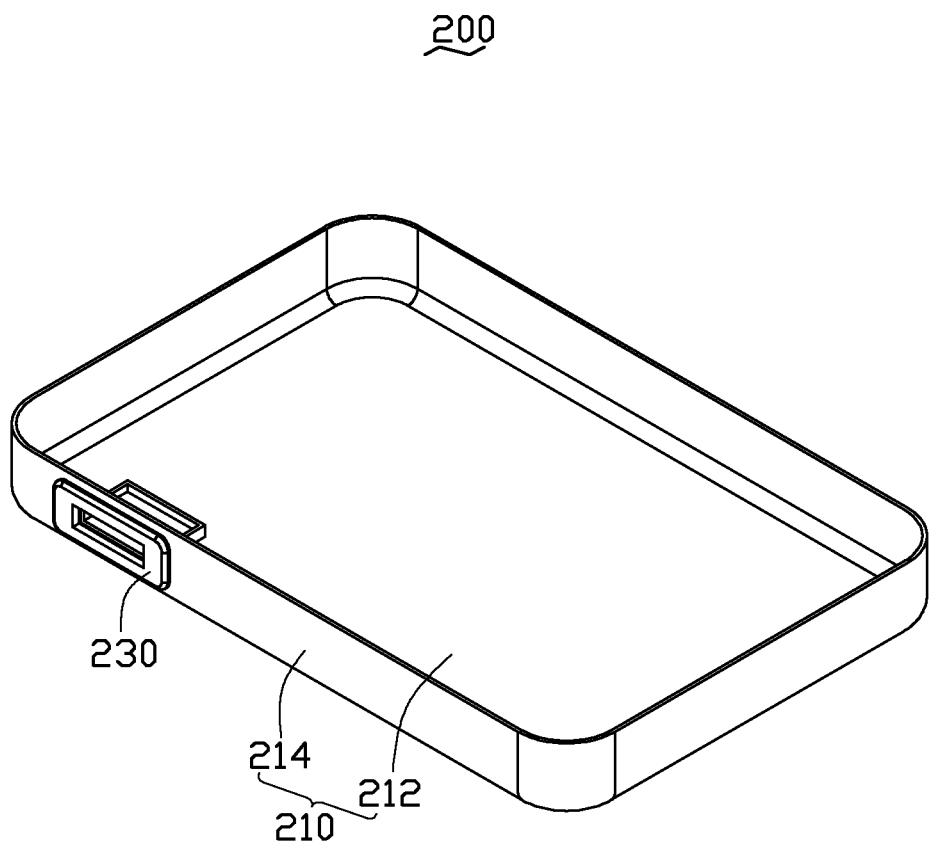
FIG. 1 is a partial, isometric view of a first embodiment of an electronic device.
Figure 2:
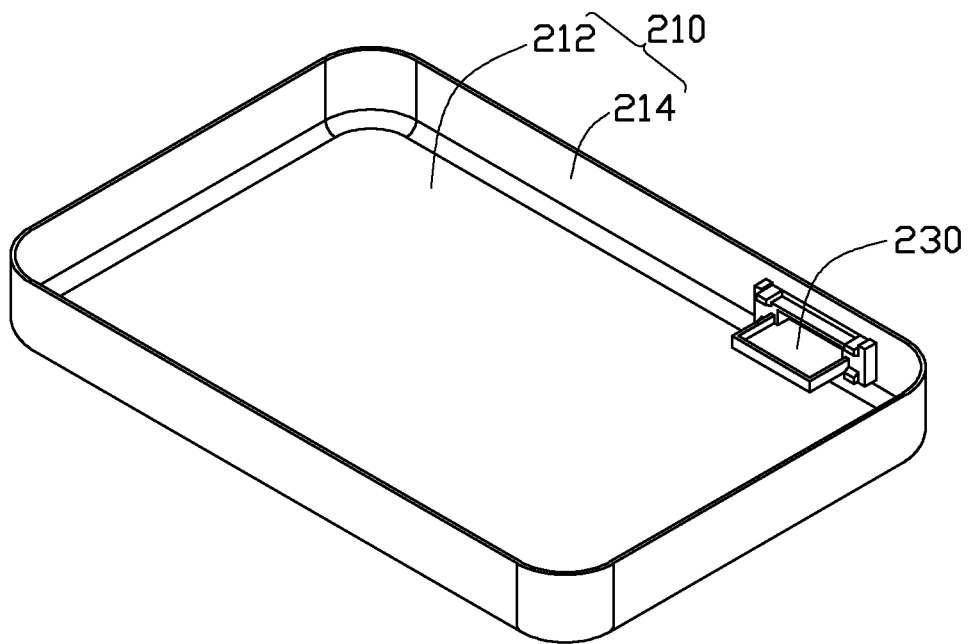
FIG. 2 is similar to FIG. 1, but viewed from another aspect.

Referring to FIGS. 1 and 2, a first embodiment of an electronic device 200 includes a housing 210 and an installation assembly 230; the installation assembly 230 is positioned in the housing 210 to receive a clip card (not shown).

Figure 3:
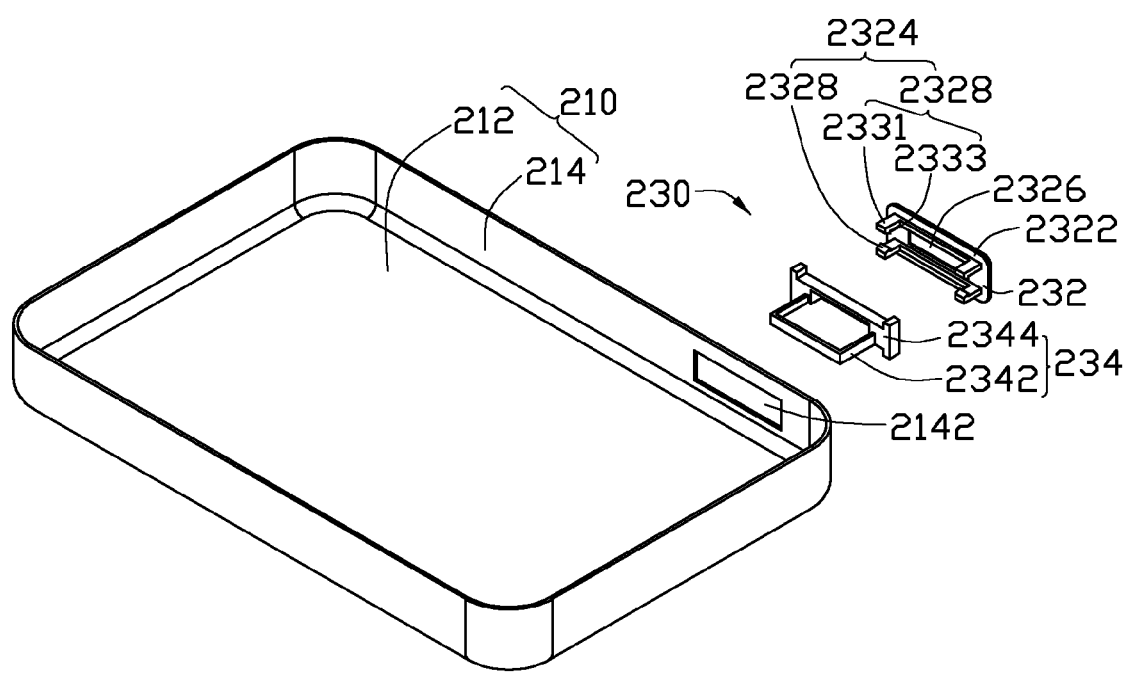
FIG. 3 is an exploded, isometric view of the electronic device of FIG. 2.

The housing 210 includes a bottom plate 212 and four side plates 214. The bottom plate 212 is substantially rectangular, and the side plates 214 extend from four edges of the bottom plate 212 toward one side of the bottom plate 212. In the illustrated embodiment, the side plates 214 are substantially perpendicular to the bottom plate 212. Referring to FIG. 3, one of the side plates 214 defines a rectangular first opening 2142.

Figure 4:
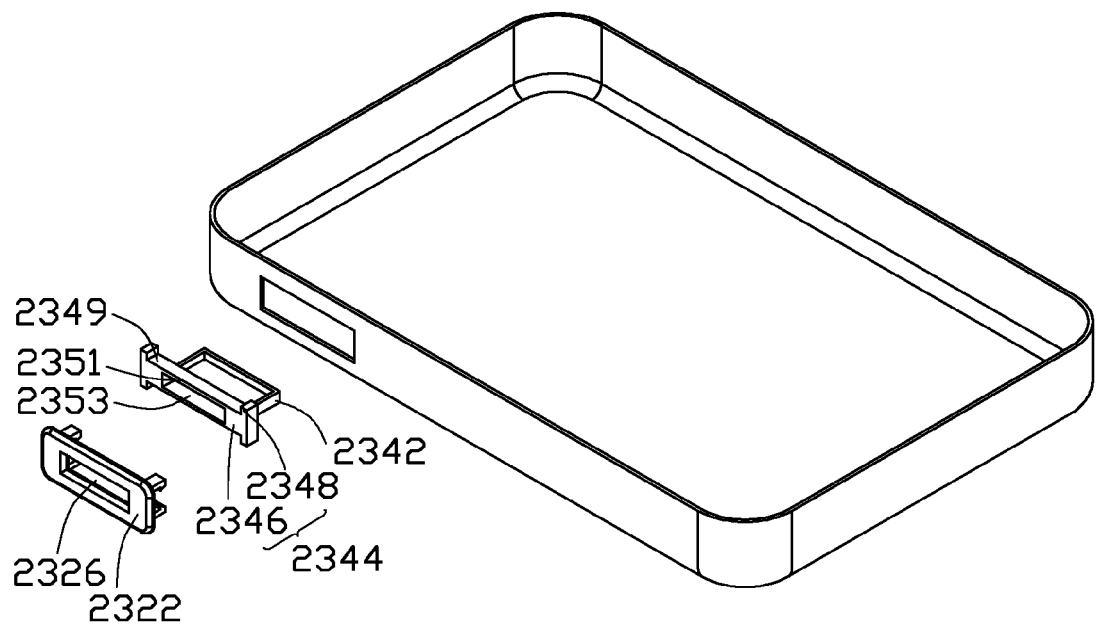
FIG. 4 is similar to FIG. 3, but viewed from another aspect.

Referring to FIGS. 3 and 4, the installation assembly 230 includes a fixing member 232 and a holding member 234. The fixing member 232 includes a base 2322 and a fixing portion 2324. The base 2322 is substantially rectangular, and the area of the base 2322 is greater than or equal to that of the first opening 2142 so that the base 2322 may cover the first opening 2142. The base 2322 defines an entrance 2326 corresponding to the first opening 2142 for allowing the clip card to be received into or ejected out. In the illustrated embodiment, the entrance 2326 is substantially rectangular, and the area of the entrance 2326 is less than that of the first opening 2142.

The fixing portion 2324 protrudes out from a side surface of the base 2322 facing the side plate 214 to resist against an inner side of the first opening 2142. In the illustrated embodiment, the fixing portion 2324 includes four grapping hooks 2328 protruding out from the side surface of the base 2322 towards the side plate 214 adjacent to four corners of the entrance 2326. The four grapping hooks 2328 are divided into two groups, and the two groups of the grapping hooks 2328 are positioned adjacent to two opposite edges of the entrance 2326. Each grapping hook 2328 includes a latching bar 2331 and a latching protrusion 2333 protruding out from a top of the latching bar 2331. In the illustrated embodiment, the latching bar 2331 is a substantially rectangular bar. Each latching protrusion 2333 is formed on an end of the latching bar 2331 away from the base 2322. Two latching protrusions 2333 of each group of the grapping hooks 2328 are positioned face to face. When the fixing portion 2324 passes through the first opening 2142, the four grapping hooks 2328 resist against four corners of the first opening 2142, thereby firmly positioning the fixing member 232 in the side plate 214.

Referring to FIGS. 3 and 4 again, the holding member 234 includes a holding portion 2342 and an engaging portion 2344. The holding member 234 is used to receive the clip card (not shown). In the illustrated embodiment, the holding portion 2342 is substantially tray-shaped. It should be appreciated that the shape of the holding portion 2342 is not limited to tray-shaped, and other shapes may be employed to accommodate the structure of the clip card.

The engaging portion 2344 is formed on an end of the holding portion 2342. The engaging portion 2344 may be engaged with the fixing portion 2324 to fix the holding member 234 to the housing 210. In the illustrated embodiment, there are two engaging portions 2344 formed on opposite sides at an end of the holding portion 2342 adjacent to the side plate 214. The two engaging portions 2344 correspond to the two groups of the gripping hooks 2328. Each engaging portion 2344 includes a fastening portion 2346 and two resisting portions 2348. The fastening portion 2346 is substantially rectangular, and includes two parallel fastening surfaces 2349. A distance between the two fastening surfaces 2349 is equal to a maximum distance between the two gripping hooks 2328 of each group thereof, and each fastening portion 2346 may thereby be fastened by each group of the gripping hooks 2328. It should be appreciated that the fastening portion 2346 is not limited to rectangular in shape, it may be of other shapes as long as it can be fastened by each group of the gripping hooks 2328. The two resisting portions 2348 protrude out from one end of the two fastening surfaces 2349. A distance between two resisting portions 2348 positioned on the same side of the two engaging portions 2344 substantially equals to a maximum distance between the two groups of the gripping hooks 2328. The holding member 234 further includes two reinforced ribs 2351 to connect together the two engaging portions 2344. Each reinforced rib 2351 is coplanar with the two fastening surfaces 2349 at a same side of the two fastening portions 2346. The holding portion 2342, the two engaging portions 2344 and the two reinforced ribs 2351 cooperatively define a second opening 2353 to allow the clip card to be received into or ejected out.

In installation, the fixing portion 2324 passes through the first opening 2142, with the four gripping hooks 2328 resisting against four corners of the first opening 2142 respectively. The base 2322 abuts against an outer surface of the side plate 214, and the entrance 2326 is corresponding to the first opening 2142. The holding member 234 is received in the housing 210, and each engaging portion 2344 is fastened by each group of the gripping hook 2328. Each fastening portion 2346 abuts against the side plate 214 and is fastened between each group of the gripping hooks 2328. The two fastening surfaces 2349 resist against two latching bars 2331 of each group of the gripping hooks 2328, respectively. The latching protrusions 2333 resist against the side surface of the two fastening portion 2346 away from the side plate 214, and the resisting portions 2348 resist against the outer surfaces of two groups of the gripping hooks 2328. Therefore, the first opening 2142 is held between the base 2322 and the engaging portions 2344, and the engaging portions 2344 are fastened with the fixing portions 2324, and the holding member 234 is fixed to the housing 210 for positioning the clip card.

Because the installation assembly 230 is fixed in the housing 210 via the holding member 234 engaged with the fixing member 232, thereby effectively avoiding deformation or destruction of the housing 210. Additionally, the side plate 214 around the first opening 2142 is fixed between the base 2322 and the engaging portions 2344, thereby increasing the mechanical strength of the side plate 214 in that region.

It should be appreciated that the engaging structure of the fixing portion 2324 and the engaging portion 2344 is not limited to just the gripping hooks 2328 engaging with the fastening portion 2346. For example, the engaging structure may be the gripping hooks 2328 engaged with the latching grooves defined in the holding member 234. The fixing portion 2324 may also be a plurality of screw studs and the engaging portions 2344 may define a plurality of screw holes, so that the engaging portions 2344 may be fixed to the fixing portion 2324 via the screw studs engaged with the screw holes. It should also be appreciated that the four gripping hooks 2328 are not limited to resisting against the four corners of the first opening 2142. When the holding member 234 is fixed to the fixing member 232, the installation assembly 230 may be fixed to the housing 210 via having both the holding member 234 and the fixing member 232 resisting against the side plate 214.

Figure 5:
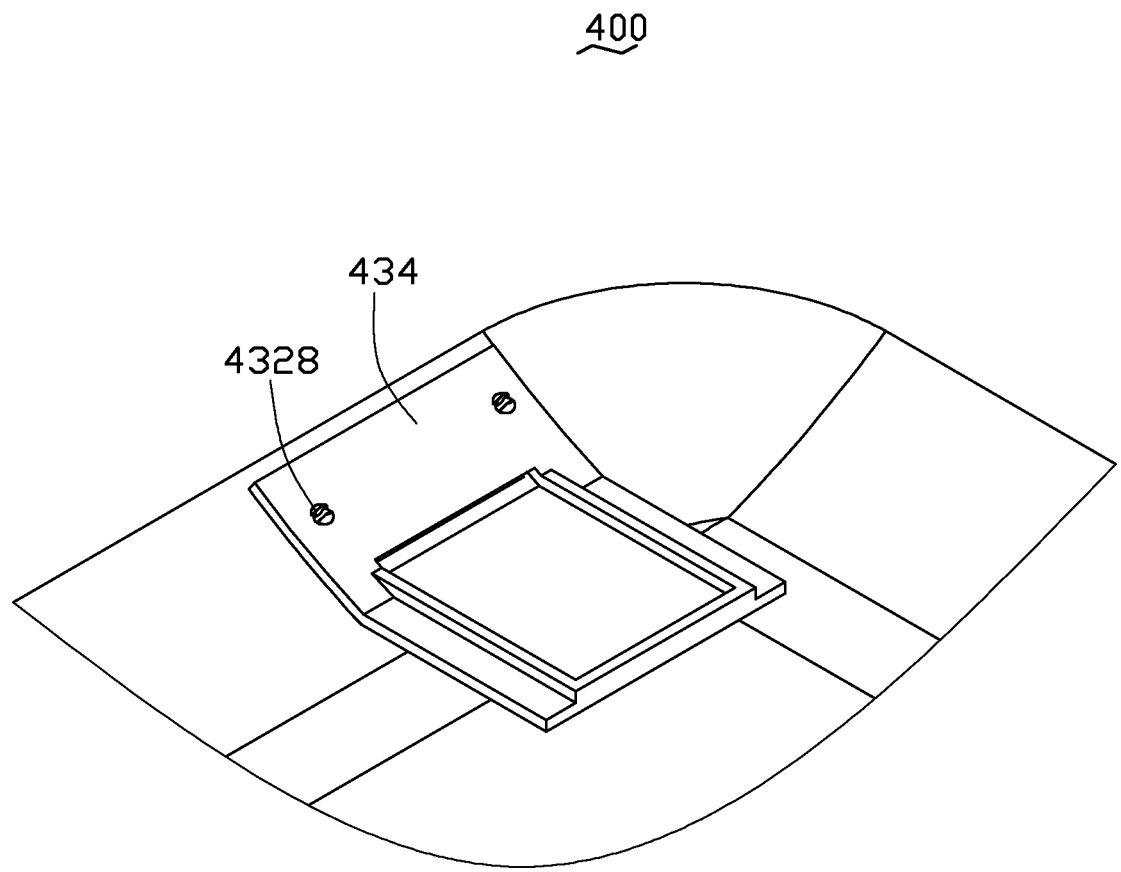
FIG. 5 is a partial, isometric view of a second embodiment of an electronic device.
Figure 6:
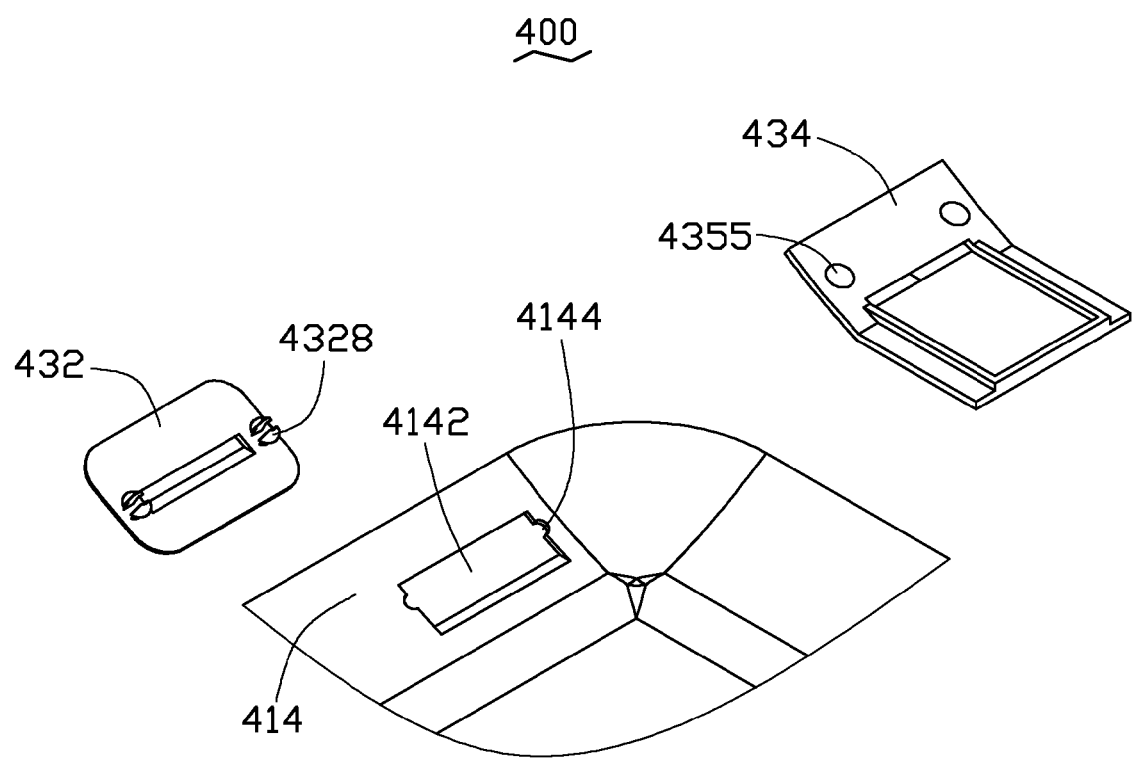
FIG. 6 is an exploded, partial isometric view of the electronic device of FIG. 5.

Referring to FIGS. 5 and 6, a second embodiment of an electronic device 400 similar to the electronic device 200 is shown, but each group of the gripping hooks 4328 of a fixing member 432 has a preset distance, and a holding member 434 defines two fastening holes 4355 for engaging with the two groups of the gripping hooks 4328. In installation, two groups of the gripping hooks 4328 pass through an opening 4142 defined in a side plate 414, and the two groups of the gripping hooks 4328 resist against opposite sides of the opening 4142, respectively. Each group of the hooks 4328 is squeezed together and is received in each fastening hole 4355. Then, a grip on the gripping hooks 4328 is relaxed so that the gripping hooks 4328 can be engaged with the fastening holes 4355 to engage the holding member 434 in the electronic device 400. It should be appreciated that the opposite side-walls of the opening 4142 define two grooves 4144 corresponding to the two groups of the gripping hooks 4328. When the two groups of the gripping hooks 4328 pass through the opening 4142, part of the two gripping hooks 4328 of each group thereof resist against each groove 4144.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device, comprising:
a housing defining a first opening; and
an installation assembly for holding a clip card in the housing, the installation assembly comprising a fixing member and a holding member, the fixing member comprising a base and a fixing portion protruding out from the base, and the base defining an entrance corresponding to the first opening for allowing the clip card to be received into or ejected out of the housing, the fixing portion comprising two groups of gripping hooks positioned around the entrance, the holding member comprising a holding portion for holding the clip card and two engaging portion formed on an end of the holding portion, wherein the fixing portion passes through the first opening, the base abuts against an outer surface of the housing with the entrance corresponding to the first opening, the engaging portion is engaged with the fixing portion to fix the holding member to the fixing member, and the engaging portion abuts against an inner surface of the housing, such that the installation assembly is fixed to the housing surrounding the first opening, each engaging portion comprises a fastening portion, the two fastening portions of the engaging portions are formed on two opposite sides of an end of the holding portion adjacent to the first opening, and each fastening portion is fastened by each group of the gripping hooks, each fastening portion comprises two parallel fastening surfaces to abut against each group of the gripping hooks engaged with each fastening portion, each engaging portion further comprises two resisting portions protruding out from one end of the two fastening surfaces, and a distance between two resisting portions positioned on same side of the two engaging portions equals to a maximum distance between the two groups of the gripping hooks.

2. The electronic device of claim 1, wherein the fixing portion resists against an inner side of the first opening.

3. The electronic device of claim 1, wherein each gripping hook comprises a latching bar extending from the base and a latching protrusion formed on an end of the latching bar away from the base, each fastening portion is fastened by the latching bars of the gripping hooks of each group of the gripping hooks, and the latching protrusions resist against a side surface of each fastening portion away from the housing.

4. The electronic device of claim 1, wherein the holding member further comprises two reinforced ribs, each reinforced rib is coplanar with the two fastening surfaces at a same side of the two fastening portions, and the two reinforced ribs connect together the two engaging portions; the holding portion, the two engaging portions and the two reinforced ribs cooperatively define a second opening.

5. The electronic device of claim 1, wherein the base of the fixing member is substantially rectangular, and an area of the base is greater than that of the first opening.

6. The electronic device of claim 1, wherein the plurality of gripping hooks are positioned around the entrance, and the engaging portion defines a plurality of latching grooves engaged with the gripping hooks.

7. The electronic device of claim 1, wherein the fixing portion comprises a plurality of screw studs positioned around the entrance, and the engaging portion defines a plurality of screw holes engaged with the screw studs.

8. The electronic device of claim 1, wherein the gripping hooks are positioned around the entrance, each group of the gripping hooks have a preset distance, the engaging portion defines fastening holes corresponding to the at least two groups of gripping hooks, and each group of the gripping hooks is to be engaged with each fastening hole.

9. The electronic device of claim 5, wherein a plurality of opposite side-walls of the first opening define a plurality of grooves corresponding to the at least two groups of gripping hooks, and part of the gripping hooks of each group thereof resist against each groove.

10. An electronic device, comprising:
a housing defining a first opening; and
an installation assembly comprising:
   a fixing member comprising a base and a fixing portion protruding out from the base, the base defining an entrance corresponding to the first opening, the fixing portion comprising two groups of gripping hooks positioned around the entrance; and
   a holding member comprising a holding portion and two engaging portions formed on an end of the holding portion, the two engaging portions comprising two fastening portions formed on opposite sides of an end of the holding portion adjacent to the first opening, wherein the fixing portion passes through the first opening, the base abuts against an outer surface of the housing with the entrance corresponding to the first opening, the two engaging portions are engaged with the fixing portion to fix the holding member to the fixing member with the two engaging portions abutting against an inner surface of the housing, each fastening portion comprises two parallel fastening surfaces to abut against each group of the gripping hooks engaged with each fastening portion, each engaging portion further comprises two resisting portions protruding out from one end of the two fastening surfaces, and a distance between the two resisting portions positioned on same side of the two engaging portions equals to a maximum distance between the two groups of the gripping hooks.

* * * * *